(12) United States Patent
Hayashi

(10) Patent No.: US 10,650,293 B2
(45) Date of Patent: May 12, 2020

(54) PRINTING APPARATUS, PRINTING METHOD, AND PRINTING SYSTEM

(71) Applicant: SEIKO EPSON CORPORATION, Tokyo (JP)

(72) Inventor: Tadashi Hayashi, Nagano (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 16/519,071

(22) Filed: Jul. 23, 2019

(65) Prior Publication Data

US 2020/0034674 A1    Jan. 30, 2020

(30) Foreign Application Priority Data

Jul. 25, 2018  (JP) .................. 2018-139227

(51) Int. Cl.
*G06K 15/02* (2006.01)
*G06F 3/12* (2006.01)

(52) U.S. Cl.
CPC ......... *G06K 15/1835* (2013.01); *G06F 3/126* (2013.01); *G06F 3/1215* (2013.01); *G06K 15/1801* (2013.01)

(58) Field of Classification Search
None
See application file for complete search history.

(56) References Cited

U.S. PATENT DOCUMENTS

| | | | |
|---|---|---|---|
| 5,428,356 A | 6/1995 | Ozaki | |
| 5,838,826 A * | 11/1998 | Enari | H04N 19/176 382/234 |
| 5,867,602 A * | 2/1999 | Zandi | G06F 17/148 375/E7.016 |
| 6,229,927 B1 * | 5/2001 | Schwartz | G06F 17/148 375/E7.016 |
| 6,549,666 B1 * | 4/2003 | Schwartz | G06F 17/148 375/E7.016 |
| 10,462,331 B2 * | 10/2019 | Kakutani | H04N 1/4053 |

(Continued)

FOREIGN PATENT DOCUMENTS

| | | |
|---|---|---|
| JP | 06-104767 A | 4/1994 |
| JP | 08-065171 A | 3/1996 |

(Continued)

*Primary Examiner* — Anh-Vinh T Nguyen
(74) *Attorney, Agent, or Firm* — Global IP Counselors, LLP

(57) ABSTRACT

A printing apparatus includes an obtaining section that obtains encoded data in which compression is performed, a decoding section that decodes encoded data to obtain image data for printing, and a printing section that performs printing by using image data for printing. The encoded data is encoded data including, for a respective one of the blocks, first compressed data in which quantized values obtained by performing orthogonal transformation for a respective one of N color components are each compressed, and second compressed data in which, by using a dictionary in which a plurality of different colors are registered as indexes, a corresponding one of the indexes associated with the color of each pixel is compressed. The decoding section decodes the first compressed data in N cycles and decodes the second compressed data in one cycle to obtain print data decoded in units of the blocks.

7 Claims, 10 Drawing Sheets

(56) References Cited

U.S. PATENT DOCUMENTS

| | | | |
|---|---|---|---|
| 2003/0118240 A1* | 6/2003 | Satoh | H04N 19/176 382/239 |
| 2004/0114810 A1* | 6/2004 | Boliek | H03M 7/30 382/232 |
| 2005/0083545 A1* | 4/2005 | Takata | G06T 5/10 358/1.9 |
| 2007/0133889 A1* | 6/2007 | Horie | H04N 19/85 382/232 |
| 2009/0154800 A1* | 6/2009 | Kojima | H04N 19/176 382/165 |
| 2018/0098069 A1* | 4/2018 | Ueki | H04N 19/172 |
| 2019/0246011 A1 | 8/2019 | Isomura | |

FOREIGN PATENT DOCUMENTS

| | | |
|---|---|---|
| JP | 09-093139 A | 4/1997 |
| JP | 2010-045485 A | 2/2010 |
| JP | 2019-140477 A | 8/2019 |

\* cited by examiner

| DICTIONARY INDEX | VARIABLE LENGTH CODE | CODE BIT LENGTH |
|---|---|---|
| 0 | 1 | 1 |
| 1 | 01 | 2 |
| 2 | 001 | 3 |
| 3 | 0000 | 4 |
| – | 0001 | 4 |

FIG. 10

| FREQUENCY COMPONENT \ QUALITY | q0 | q1 | q2 |
|---|---|---|---|
| LL3 | $2^0$ | $2^0$ | $2^0$ |
| HL3, LH3, HH3 | $2^1$ | $2^1$ | $2^1$ |
| HL2, LH2, HH2 | $2^3$ | $2^2$ | $2^2$ |
| HL1, LH1, HH1 | $2^5$ | $2^4$ | $2^3$ |

PRINTING APPARATUS, PRINTING METHOD, AND PRINTING SYSTEM

The present application is based on, and claims priority from JP Application Serial Number 2018-139227, filed Jul. 25, 2018, the disclosure of which is hereby incorporated by reference herein in its entirety.

BACKGROUND

1. Technical Field

The present disclosure relates to a printing apparatus.

2. Related Art

A printing system including a printing apparatus and a host computer that transfers image data to the printing apparatus is known. In such a printing system, in order to reduce the decrease in transfer speed in transferring image data from a host computer to a printing apparatus, techniques are employed in which image data is encoded with a variable length code such as a Huffman code, and the encoded data resulting from encoding is transferred to the printing apparatus, where the encoded data is decoded. Although encoding of image data has relieved the bottleneck in transfer speed, employment of a variable length code, which has a high compression efficiency, as an encoding method has made it difficult to improve the throughput of decoding. In a printing apparatus, printing may stop if decoding is not performed at a predetermined speed or higher. Various techniques have been proposed regarding improvement in the processing speed for decoding of variable length codes. For example, in JP-A-2010-45485, techniques in which a plurality of variable length code decoders are included and decoding processes in the variable length code decoders are performed in parallel have been proposed.

However, the code length of a variable length code is not determined unless a variable length code table is looked up, and therefore decoding a plurality of variable length codes requires sequential lookup in the variable length code table. Thus, it is difficult to improve the speed at which a decoding process is performed in one cycle. In addition, when a color image of red (R), green (G), and blue (B) is encoded, collectively encoding color components R, G, and B as a single code results in a long code length and requires lookup in enormous variable length code tables. Thus, it is difficult to improve the speed of a decoding process. Accordingly, it is desired that, by individually encoding the color components R, G, and B to achieve efficient processing in one cycle, the speed at which a decoding process of the entire image is performed be improved and the time required for printing the entire image be reduced.

SUMMARY

According to an embodiment of the present disclosure, a printing apparatus is provided. This printing apparatus is a printing apparatus that prints an image. The printing apparatus includes at least one obtaining section that divides the image into a plurality of blocks of a plurality of pixels and obtains encoded data in which compression is performed in units of the blocks, at least one decoding section that decodes the obtained encoded data in units of the blocks to obtain image data for printing, and a printing section that performs printing by using the obtained image data for printing. The encoded data is encoded data including, for a respective one of the blocks, first compressed data in which quantized values obtained by quantizing frequency components obtained by performing orthogonal transformation for a respective one of N color components, N being an integer of two or more, are respectively compressed by variable length codes and second compressed data in which, by using a dictionary in which a plurality of different colors are registered as indexes, a corresponding one of the indexes associated with a color of each pixel is compressed by a variable length code. The at least one decoding section decodes, among the obtained encoded data, the first compressed data in N cycles and decodes the second compressed data in one cycle by referencing the dictionary to obtain print data decoded in units of the blocks.

BRIEF DESCRIPTION OF THE DRAWINGS

FIG. 10 is an illustrative diagram illustrating exemplary quantization shift values.

DESCRIPTION OF EXEMPLARY EMBODIMENTS

A. Embodiment

Figure 1:
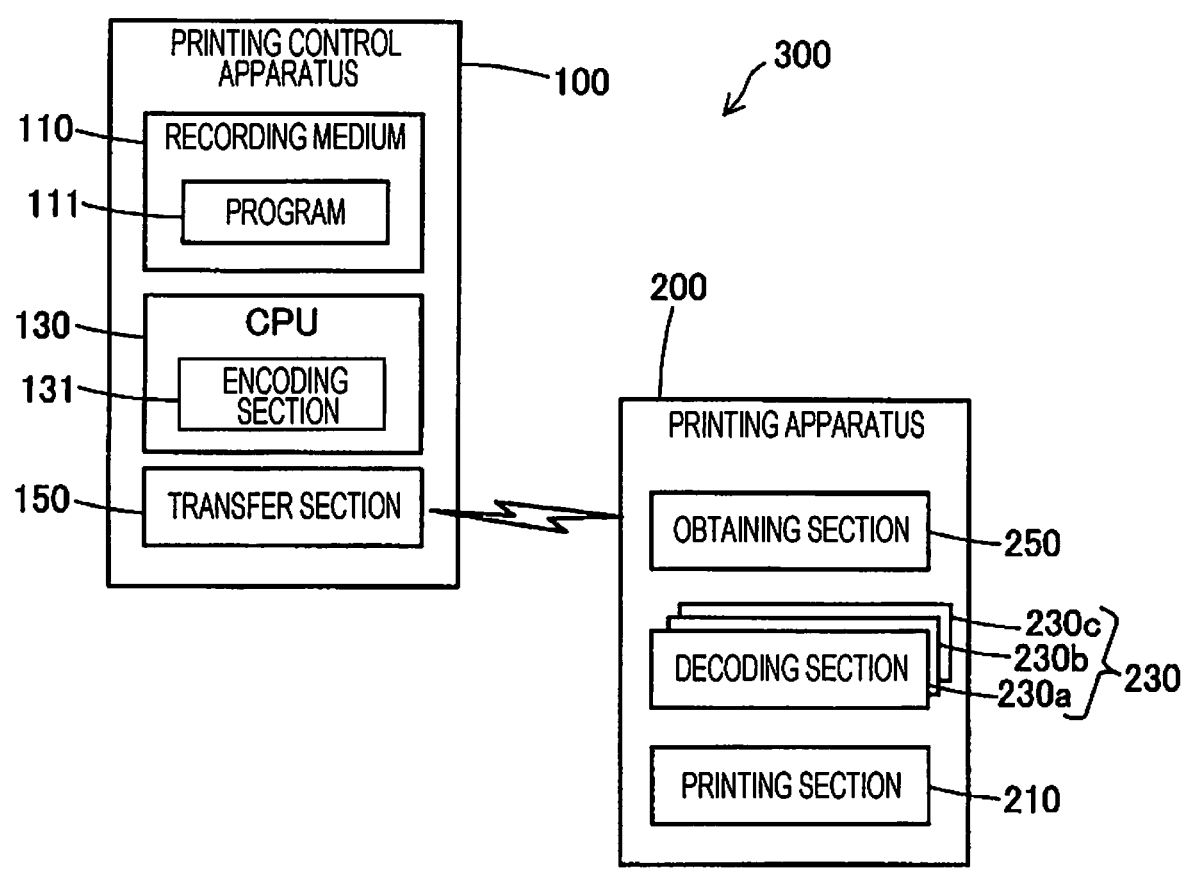
FIG. 1 is a block diagram illustrating a configuration of a printing system according to an embodiment.

A1: Apparatus Configurations:

FIG. 1 is a block diagram illustrating a configuration of a printing system 300 according to an embodiment of the present disclosure. The printing system 300 includes a printing control apparatus 100 and a printing apparatus 200 that actually prints an image under control of the printing control apparatus 100. The printing system 300 functions as a printing apparatus in the broad sense, where the printing apparatus functions as an integral whole.

The printing control apparatus 100 is composed of a computer. The printing control apparatus 100 encodes image data input from a user by using a variable length code and transmits to the printing apparatus 200 the encoded data resulting from the encoding. The printing control apparatus 100 includes a recording medium 110, a central processing unit (CPU) 130, and a transfer section 150. The recording medium 110, the CPU 130, and the transfer section 150 are all coupled by an internal bus, which is not illustrated in the drawings.

The recording medium 110 includes a random access memory (RAM), a read-only memory (ROM), or the like. A program 111 is recorded on the recording medium 110. For example, a printer driver, a program for executing an image encoding process described later, and the like corresponds to the program 111. In addition to the program 111, various tables and dictionaries and the like that are used in the image encoding process are stored on the recording medium 110.

The CPU 130 includes an encoding section 131. The functions of the encoding section 131 are achieved by the CPU 130 executing a control program stored in the recording medium 110.

The encoding section 131 selects either a reversible mode or an irreversible mode and compresses image data of an image to be printed, which has been input by a user, in the selected mode. The term "image to be printed" as used in the present embodiment denotes an RGB color image, which is an image of a total of 24 bits per pixel; 8 bits for each of R, G, and B. The image to be printed may be an image of 9 bits or more for each of R, G, and B per pixel. Detailed description of encoding of an image will be given later.

The transfer section 150 performs wireless communication between the printing control apparatus 100 and the printing apparatus 200 to transmit encoded data, which has been encoded by the encoding section 131, to the printing apparatus 200. The transfer section 150 performs wireless communication in compliance with standards for a wireless local-area network (LAN) and the like including, for example, Bluetooth (registered trademark) and Wi-Fi (registered trademark).

The printing apparatus 200 is an ink jet printer that discharges ink of four colors, specifically cyan (C), magenta (M), yellow (Y), and black (K). The printing apparatus 200 decodes encoded data transmitted from the printing control apparatus 100 to obtain print data that has been decoded (hereinafter called "decoded print data") and forms dots on a print medium by discharging ink from a plurality of nozzles onto the print medium based on such decoded print data, thereby printing images, characters, and the like. The printing apparatus 200 includes an obtaining section 250, a decoding section 230, and a printing section 210.

The obtaining section 250 performs wireless communication between the printing apparatus 200 and the printing control apparatus 100 to obtain encoded data from the printing apparatus 200. The obtaining section 250, like the transfer section 150 of the printing control apparatus 100, performs wireless communication in compliance with standards for a wireless LAN and the like, for example, including Bluetooth (registered trademark) and Wi-Fi (registered trademark).

The decoding section 230 decodes encoded data, which has been encoded by the encoding section 131 of the printing control apparatus 100, to obtain decoded print data. In the present embodiment, the decoding section 230 is implemented not by a general-purpose computer but by hardware. The decoding section 230 is circuits mounted on a semiconductor chip and has a configuration in which a plurality of such circuits are arranged in parallel. The decoding section 230 has a configuration in which three decoding sections 230a, 230b, and 230c having configurations similar to one another are arranged in parallel. Each of the decoding sections 230a, 230b, and 230c is able to decode data of 1 pixel in three cycles. The detailed configuration of the decoding section 230 will be described later.

The printing section 210 performs a process of generating print data from decoded print data and an integrated control process of printing based on the print data. These processes are known techniques and therefore detailed description thereof is omitted. However, in overview, the printing section 210 converts the resolution of decoded print data into print resolution thereof, so that the decoded print data is converted into image data represented by gray scale values of ink colors C, M, Y, and K. The printing section 210 converts image data of each ink color into the gray scale values of two gray scale levels indicating the presence and absence of a dot of the ink color, that is, the dot presence (255) and the dot absence (0). The printing section 210 rasterizes data indicating whether dots of ink colors, C, M, Y, and K are present or absent on a medium P, and generates print data including a command for print controlling. The printing section 210 controls sections of the printing apparatus 200 to cause the sections to print the print data.

Figure 2:
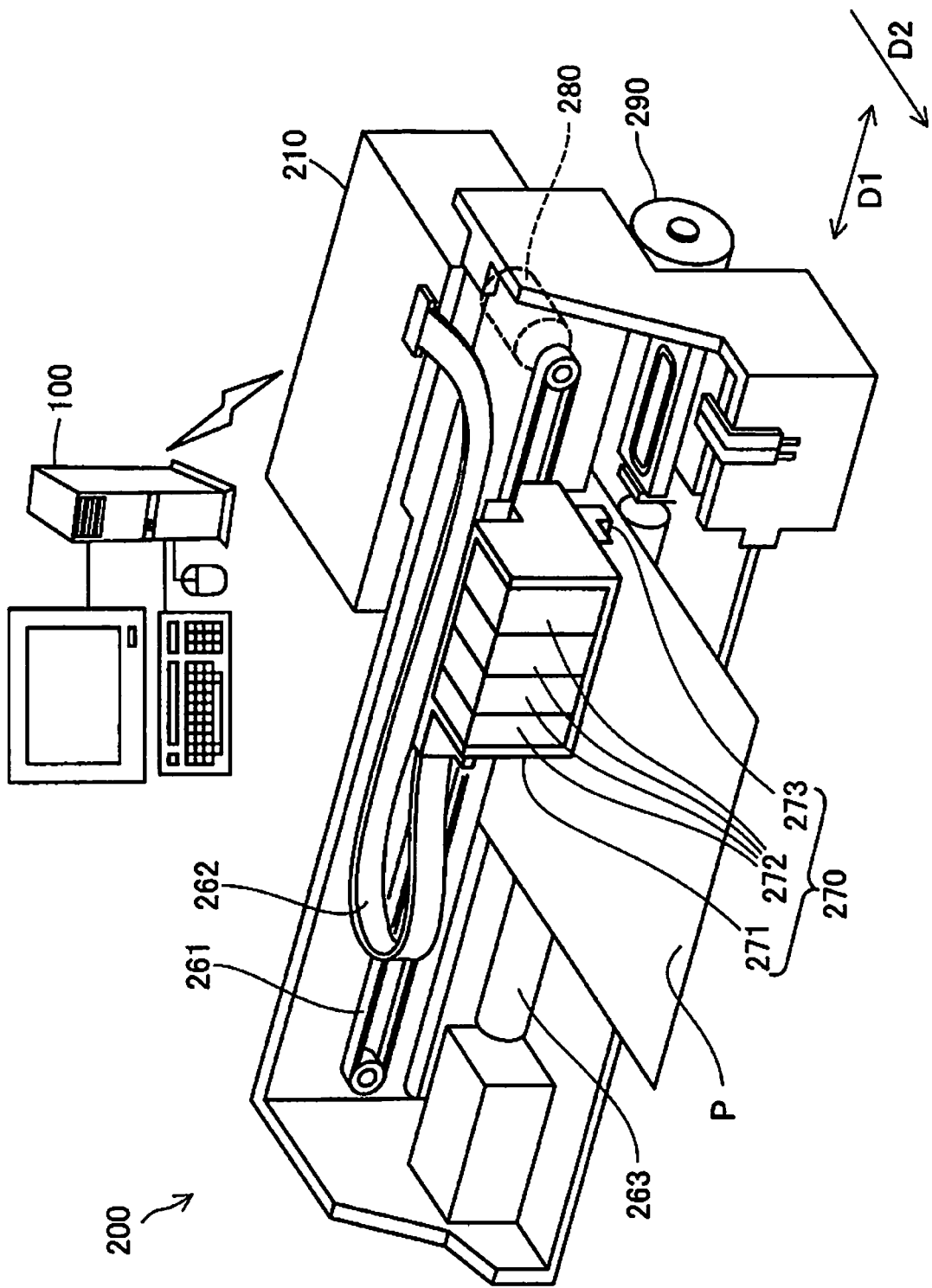
FIG. 2 is an illustrative diagram illustrating a schematic configuration of a printing apparatus.

FIG. 2 is an illustrative diagram illustrating a schematic configuration of the printing apparatus 200. The printing apparatus 200 includes, in addition to the printing section 210 described above, a head unit 270, a carriage motor 280, a transport motor 290, a drive belt 261, a flexible cable 262, and a platen 263.

The printing section 210 is a device including a CPU, a RAM, and an input/output interface, and each section of the printing apparatus 200 is controlled by the CPU executing a computer program stored in the RAM.

The head unit 270 is electrically coupled via the flexible cable 262 to the printing section 210. The head unit 270 is attached to a carriage guide, which is not illustrated in the drawings, so as to be able to reciprocate in a main scanning direction D1. The head unit 270 reciprocates along the main scanning direction D1 by the motive power of the carriage motor 280 transmitted via the drive belt 261.

The head unit 270 includes a carriage 271, four ink cartridges 272, and a printhead 273. In the carriage 271, four ink cartridges 272 of different colors of ink are inserted. In the present embodiment, the four ink cartridges 272 respectively contain cyan (C), magenta (M), yellow (Y), and black (K) ink. In the printhead 273, a plurality of nozzle rows that discharge ink are provided on a surface facing a print medium P. Ink supplied from the ink cartridge 272 to the printhead 273 is discharged as droplets from nozzles.

The transport motor 290 operates in response to control signals from the printing section 210. The motive power of the transport motor 290 is transmitted to the platen 263 to transport the print medium P in a sub-scanning direction D2.

Upon completing generation of print data, the printing section 210 drives the transport motor 290 so as to transport the print medium P to a position in the sub-scanning direction D2 at which printing begins. The printing section 210 drives the carriage motor 280 so as to move the head unit 270 to a position in the main scanning direction D1 at which printing begins. The printing section 210 alternately repeats control for moving the head unit 270 along the main scanning direction D1 and discharging ink from the head unit 270 onto the print medium P and control of the transport motor 290 for transporting the print medium P in the sub-scanning direction D2, which is the printing direction. Thus, an image is printed on the print medium P. In FIG. 2, the head unit 270 reciprocates along the main scanning direction D1 and the print medium P is transported from upstream to downstream in the sub-scanning direction D2 that crosses the main scanning direction D1. In the present embodiment, the sub-scanning direction D2 is a direction at right angles to the main scanning direction D1.

Figure 3:
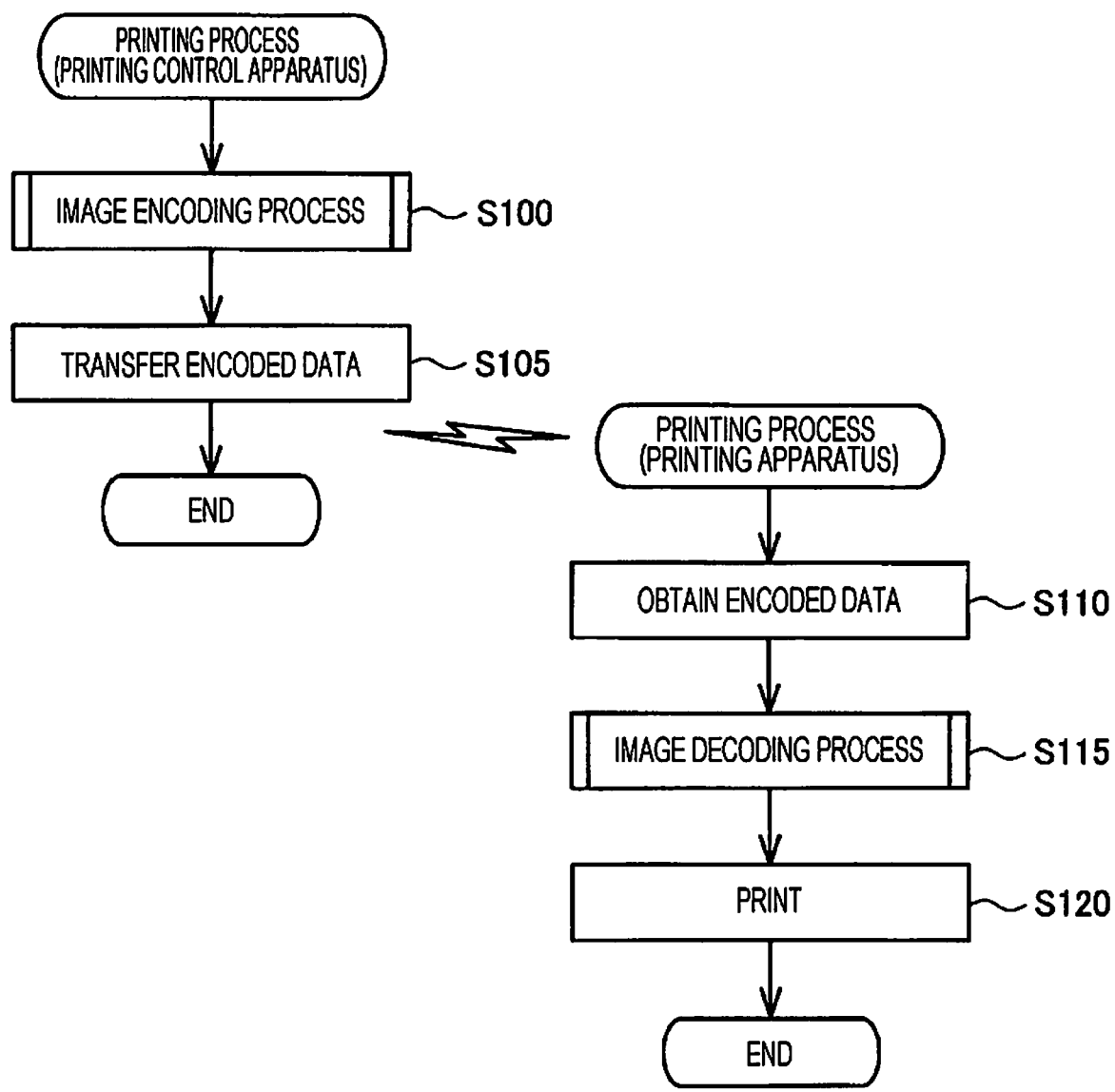
FIG. 3 includes flowcharts illustrating processing procedures of printing processes that are executed by a printing control apparatus and a printing apparatus.

A2. Printing Processes:

FIG. 3 includes flowcharts illustrating processing procedures of printing processes performed by the printing control apparatus 100 and the printing apparatus 200. As illustrated on the left side of FIG. 3, when, in the printing control apparatus 100, a user specifies an image to be printed to provide a printing instruction, the printing process in the printing control apparatus 100 begins. The encoding section 131 performs an image encoding process (step S100). The image encoding process is performed in units of blocks described later. Next, the transfer section 150 performs wireless communication with the obtaining section 250 to transfer encoded data to the printing apparatus 200 (step S105). At this point, the encoded data is transferred in units of bands described later.

As illustrated on the right side of FIG. 3, upon receipt of encoded data by the obtaining section 250 via the transfer section 150 from the printing control apparatus 100, the printing process in the printing apparatus 200 begins. The obtaining section 250 obtains encoded data (step S110). Then, the decoding section 230 performs an image decoding process (step S115). The image decoding process, like the image encoding process, is performed in units of blocks described later. Then, the printing section 210 prints an image to be printed, based on the decoded print data (step S120). Hereinafter, with reference to FIG. 4 to FIG. 12, processing of the image encoding process and the image decoding process will be described.

Figure 4:
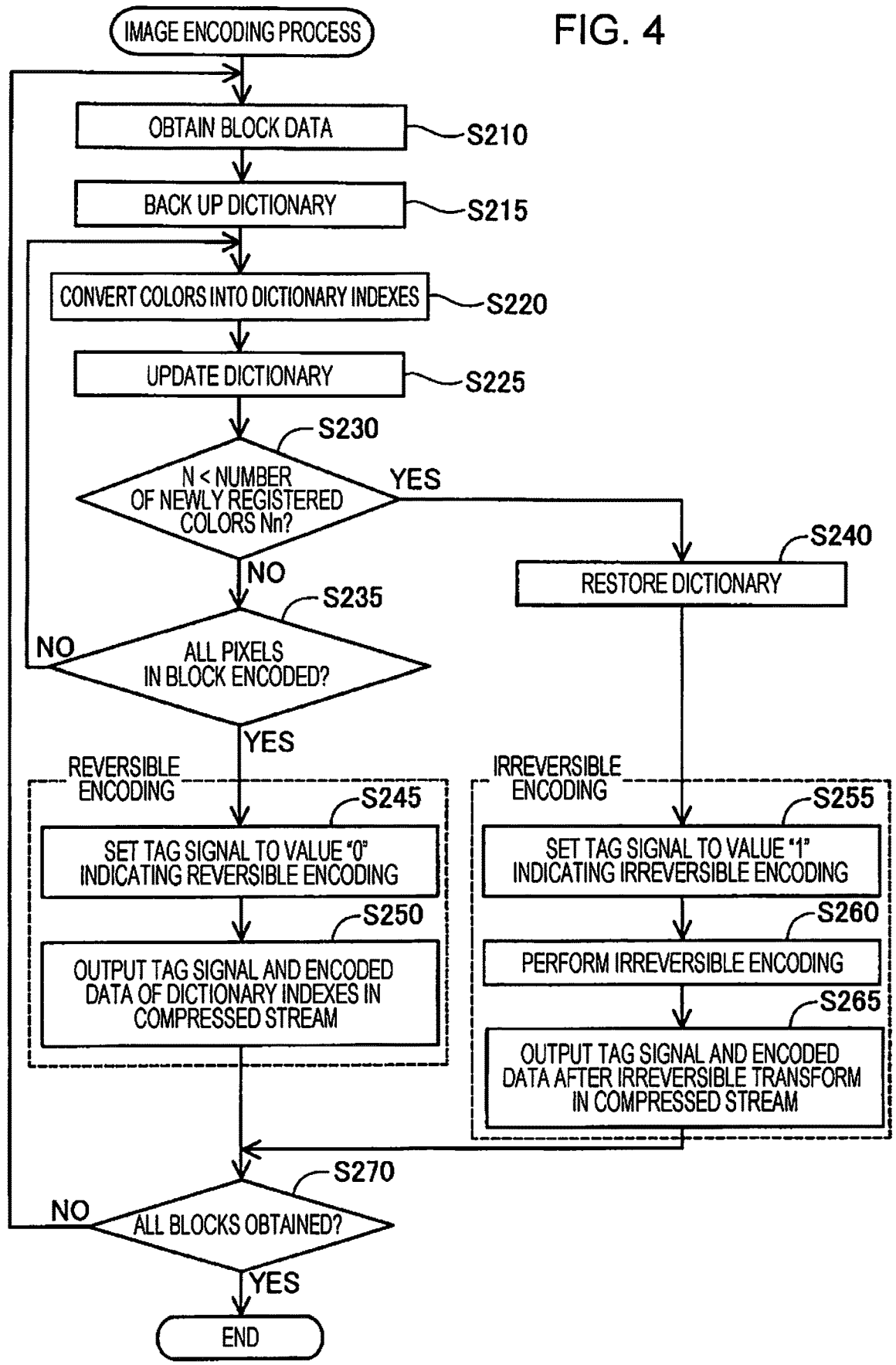
FIG. 4 is a flowchart illustrating a processing procedure of an image encoding process.

A3. Image Encoding Process:

FIG. 4 is a flowchart illustrating the procedure of the image encoding process of step S100. First, the encoding section 131 obtains block data (step S210). The term "block" means a configuration of a plurality of pixels in an image to be printed and, in the present embodiment, one block consists of 8 by 8 pixels. When the number of pixels either in the vertical direction or in the horizontal direction of the entire image to be printed is not a multiple of eight, a block whose size is less than 8 by 8 pixels is produced at an end of the image. In this case, the encoding section 131 adds dummy pixels to the block so that the block consists of 8 by 8 pixels, thereby obtaining pixel data of blocks of 8 by 8 pixels. Note that the block is not limited to consisting of 8 by 8 pixels but may consist of 4 by 4 pixels, 16 by 16 pixels, or any other number of pixels.

The encoding section 131 then backs up a dictionary described later by using the recording medium 110 (step S215). The dictionary is baked up in order to allow the dictionary to be restored to the pre-update state when the dictionary has been updated. Detailed description of the configuration and the like of the dictionary will be given later.

The encoding section 131 then converts the colors of the pixels of interest into dictionary indexes (step S220). In step S220, the encoding section 131 sequentially specifies 64 pixels constituting a block, one pixel by one pixel, and converts a combination of color components R, G, and B per pixel into a dictionary index.

Figures 5, 6:
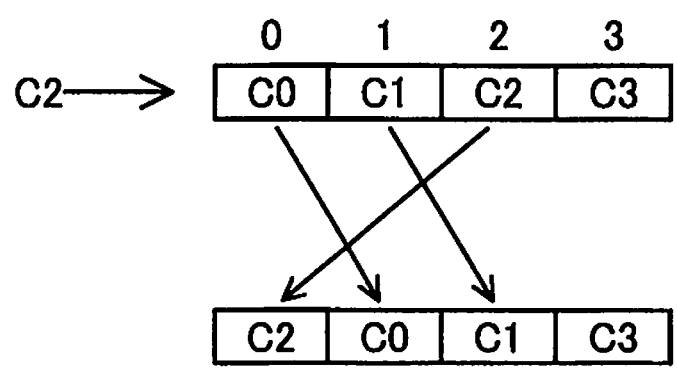
FIG. 5 is an illustrative diagram illustrating an example of the relationship among the dictionary index, the variable length code, and the code bit length.
FIG. 6 is an illustrative diagram schematically illustrating a manner in which a dictionary is updated.

FIG. 5 is an illustrative diagram illustrating an example of the relationship among the dictionary index, the variable length code, and the code bit length. As the dictionary indexes, N (N being a natural number) different colors are registered, where N is a predetermined fixed value. The dictionary indexes in the present embodiment are four indexes 0, 1, 2, and 3 for convenience of explanation. Note that the number of dictionary indexes is not limited to four and may be any other natural number. As illustrated in FIG. 5, the dictionary indexes are respectively associated with variable length codes different from each other. The code bit length is the bit length of a variable length code. In the present embodiment, variable length codes are respectively associated with dictionary indexes such that the code bit length of a variable length code associated with dictionary index 0 is shortest.

In the step S220 mentioned above, the encoding section 131 identifies, among the dictionary indexes, a dictionary index to which the combination of colors R, G, and B of the pixel of interest corresponds, and outputs a variable length code associated with the identified dictionary index. Specifically, as illustrated in FIG. 5, when the color of the pixel of interest is the color registered as dictionary index 0, the encoding section 131 outputs "1" as the variable length code. In this case, the code bit length is "1". That is, the amount of data of the code is 1 bit. When the color of the pixel of interest is the color registered as dictionary index 1, the encoding section 131 outputs "01" as the variable length code. In this case, the code bit length is "2". That is, the amount of data of the code is 2 bits.

Similarly, when the color of the pixel of interest is the color registered as dictionary index 2 or 3, the encoding section 131 outputs "001" or "0000" as the variable length code. In this case, the code bit length is "3" or "4". That is, the amount of data of the code is 3 bits or 4 bits.

When the color of the pixel of interest is a color that is not registered in the dictionary, the encoding section 131 outputs "0001" as the variable length code. In this case, the code bit length is "4". That is, the amount of data of the code is 4 bits.

After performing the process described above, the encoding section 131 updates the dictionary (step S225 in FIG. 4).

Figure 7:
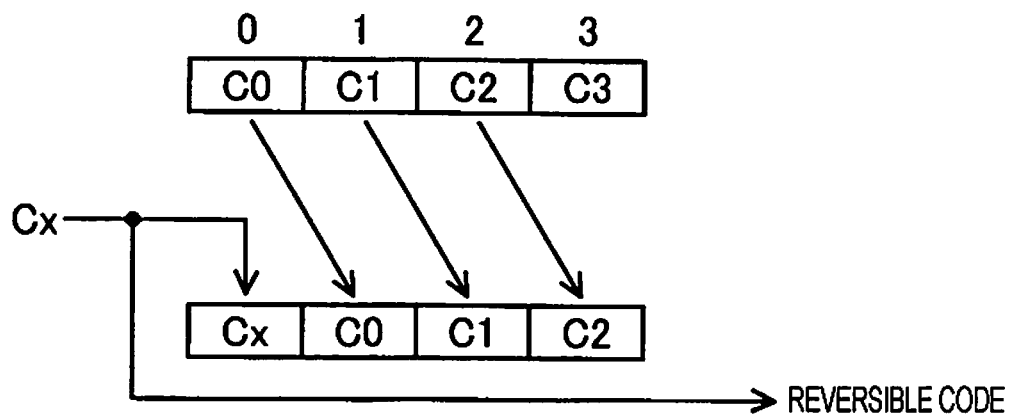
FIG. 7 is an illustrative diagram schematically illustrating a manner in which a dictionary is updated.

FIG. 6 and FIG. 7 are illustrative diagrams schematically illustrating manners in which the dictionary is updated. In FIG. 6, an example in which color C0 is registered as dictionary index 0, color C1 is registered as dictionary index 1, color C2 is registered as dictionary index 2, and color C3 is registered as dictionary index 3 is illustrated. In FIG. 7, an example in which the color of the pixel of interest is not registered in the dictionary is illustrated.

As illustrated in FIG. 6, when the color of the pixel of interest is color C2, color C2 is registered as the top dictionary index 0. Further, dictionary indexes upper than the dictionary index as which the color of the pixel of interest has been registered are moved back by one. Specifically, color C0 is registered as dictionary index 1 and color C1 is registered as dictionary index 2. Dictionary indexes lower than the dictionary index as which the color of the pixel of interest has been registered are not changed. That is, in the example illustrated in FIG. 5, dictionary index 3 is not changed.

The case where the color of the pixel of interest is not registered in the dictionary will now be described. In FIG. 7, colors registered in the dictionary before updating are the same as in the example illustrated in FIG. 6. As illustrated in FIG. 7, color Cx of the pixel of interest is not registered in the dictionary. In this case, color Cx is newly registered as the top dictionary index 0. Further, each of dictionary indexes 0, 1, and 2 is moved back by one. Specifically, color C0 is registered as dictionary index 1, color C1 is registered as dictionary index 2, and color C2 is registered as dictionary index 3. Color C3 that has been registered as the lowest dictionary index 3 is deleted. Note that, in the case where, as described above, the color of the pixel of interest is a color that is not registered in the dictionary, in encoding of the dictionary, "0001" is output as a variable length code and a reversible fixed-length code indicating color Cx of the pixel of interest is output.

Since, in step S225 mentioned above, the encoding section 131 updates the dictionary according to the procedure described above, the colors registered in the dictionary are four different colors that have been most recently registered in the dictionary among colors previously registered in the dictionary. In addition, in the case of encoding the color registered as dictionary index 0, the dictionary is not updated. The reason for moving the most recently encoded color to the top dictionary index 0 in such a manner is as follows. Since the code bit length of a variable length code associated with dictionary index 0 is shortest, the higher the appearing frequency of a color, the shorter the code to be used for encoding the color. This enables the amount of information of encoded data to be reduced. Note that, with a configuration in which the shortest code bit length is associated with a dictionary index that is not at the top of indexes, the most recently encoded color may be registered as such a dictionary index.

As illustrated in FIG. 4, the encoding section 131 determines whether the number of newly registered colors Nn, which is the number of colors newly registered in the dictionary, is greater than a reference value N (step S230). In the present embodiment, the "reference value N" is a predetermined natural number. In the present embodiment, the reference value N is set to four for convenience of explanation as described above. Note that the reference value N may be set to any other natural number.

In step S230, if the number of newly registered colors Nn is less than or equal to the reference value N (step S230: NO), the encoding section 131 determines whether all the pixels in the block have been encoded (step S235). If there remains a pixel that has not been encoded (step S235: NO), the encoding section 131 returns to step S220 described above and repeats steps S220 to S235 described above.

If while the condition that the number of newly registered colors Nn is less than or equal to the reference value N is satisfied, all the pixels in the block have been encoded (step S235: YES), the encoding section 131 performs reversible encoding. Specifically, the encoding section 131 sets a tag signal to a value of zero indicating reversible encoding (step S245). The term "tag signal" denotes a bit flag indicating a coding mode type. In the present embodiment, there are two types of modes, an irreversible mode and a reversible mode using a dictionary, as the coding modes. The encoding section 131 then outputs, in a compressed stream, the tag signal and encoded data obtained by encoding dictionary indexes of one block, 64 pixels, which have been encoded in step S220 (step S250). Specifically, the encoding section 131 outputs the tag signal of a fixed length of 1 bit and variable length codes for one block in this order in a compressed stream. Thus, reversible encoding of one block is complete. Compressed data obtained in step S220, step S245, and step S250 corresponds to the second compressed data described in Summary section.

The encoding section 131 then determines whether all the block data constituting the image to be printed has been obtained (step S270). If all the block data has not been obtained, that is, if block data that has not yet been encoded remains (step S270: NO), the encoding section 131 returns to step S210 mentioned above.

If the number of newly registered colors Nn is greater than the reference value N before all the pixels in the block are encoded (step S230: YES), the encoding section 131 restores the dictionary by utilizing backing up of the dictionary in step S215 mentioned above (step S240). This is because, for the obtained block, irreversible encoding is to be performed and because a dictionary that has been updated for reversible encoding will not be used, and because, in step S240, the dictionary is restored to the original state to be used when encoding is to be performed for the next block.

The encoding section 131 then performs an irreversible encoding process. Specifically, the encoding section 131 sets the tag signal to a value of one indicating irreversible encoding (step S255). Note that, in step S245 and step S255, the value indicating reversible encoding may be one and the value indicating irreversible encoding may be zero. The encoding section 131 then performs irreversible encoding (step S260). In the present embodiment, the Haar wavelet transform is employed.

Figure 8:
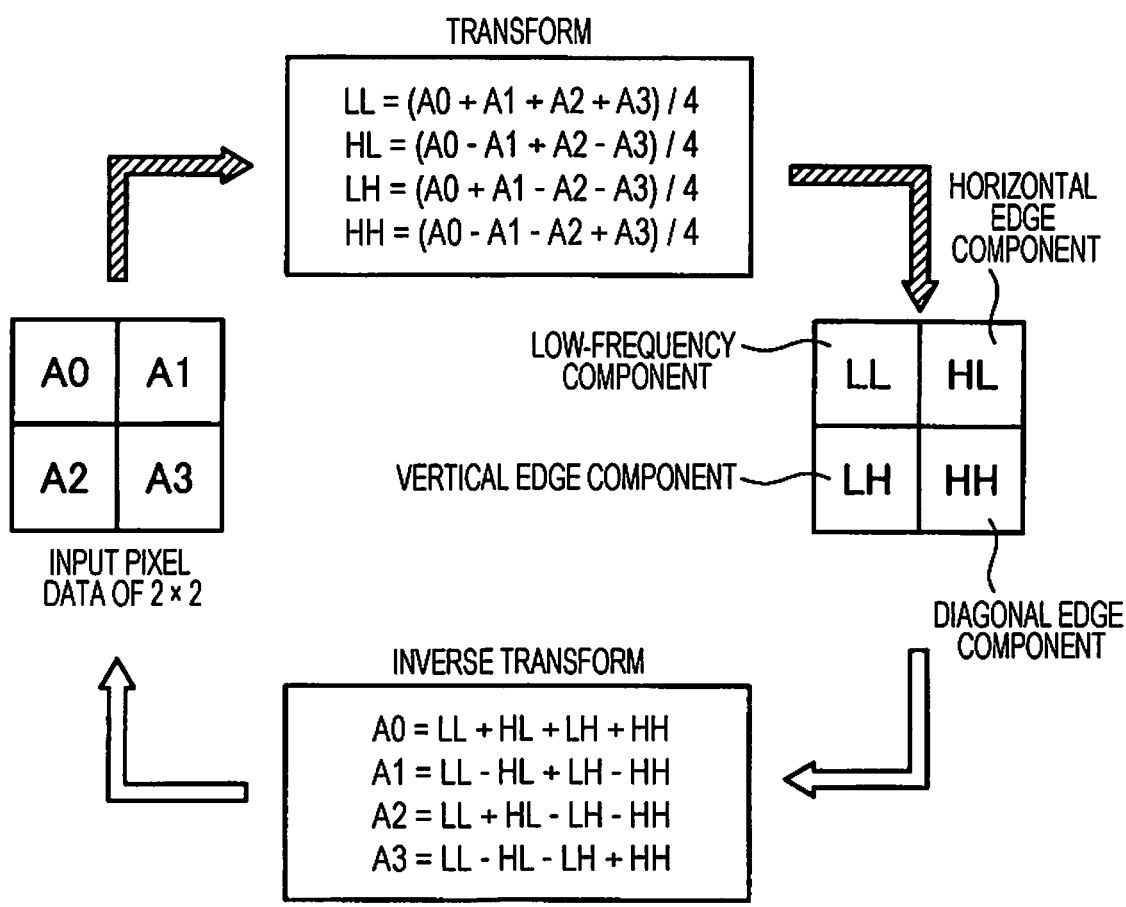
FIG. 8 is an illustrative diagram schematically illustrating computations of the Haar wavelet transform and inverse transform.

FIG. 8 is an illustrative diagram schematically illustrating computations of the Haar wavelet transform and inverse transform. Although, as described above, in the present embodiment, a block consists of 8 by 8 pixels and therefore input pixel data is 8 by 8 pixels, the case where input pixel data is 2 by 2 pixels is illustrated in FIG. 8 for convenience of explanation. Four pixels of A0 to A3 of the input pixel data are transformed, for each of color components R, G, and B, into a low-frequency component LL, a horizontal edge component HL, a vertical edge component LH, and a diagonal edge component HH. In the present embodiment, the encoding section 131 uses only addition and subtraction computation and shift computation as the computations for transforming input pixel data.

Figure 9:
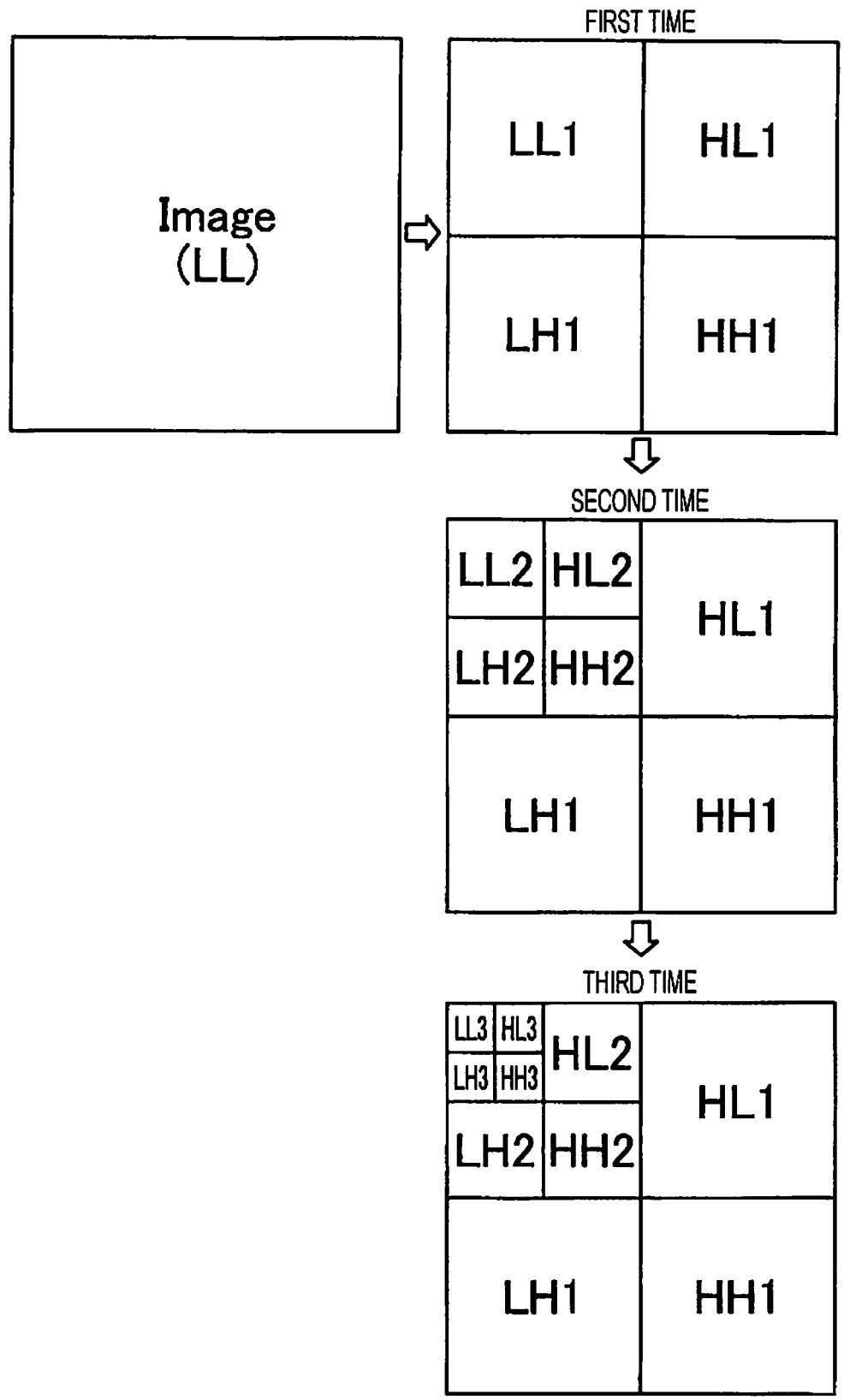
FIG. 9 is an illustrative diagram schematically illustrating a manner of Haar wavelet transforms.

FIG. 9 is an illustrative diagram schematically illustrating manners of the Haar wavelet transform actually performed in the present embodiment. In FIG. 9, the case where input pixel data is 8 by 8 pixels is illustrated. As illustrated in FIG. 9, the encoding section 131 performs the wavelet transform of the low-frequency component LL three times hierarchically. Specifically, input pixel data is divided for each of the color components R, G, and B into four subbands, each of which is 4 by 4 pixels, by the first wavelet transform. That is, the input pixel data is transformed into a low-frequency component LL1 of 4 by 4 pixels, a horizontal edge component HL1 of 4 by 4 pixels, a vertical edge component LH1 of 4 by 4 pixels, and a diagonal edge component HH1 of 4 by 4 pixels. Note that, in the description hereinafter, the low-frequency component may be called a direct current (DC) component and the horizontal component, the vertical edge component, and the diagonal edge component may be called an alternating current (AC) coefficient group.

Next, in the second transform, a wavelet transform of the low-frequency component LL1 obtained by the first transform is performed for each of the color components R, G, and B, such that the low-frequency component LL1 is divided into four subbands, each of which is 2 by 2 pixels. That is, the low-frequency component LL1 is transformed into a low-frequency component LL2, a horizontal edge component HL2, a vertical edge component LH2, and a diagonal edge component HH2, each of which is 2 by 2 pixels. In the third wavelet transform, a wavelet transform of the low-frequency component LL2 obtained in the second wavelet transform is performed for each of the color components R, G, and B, such that the low-frequency component LL2 is divided into four subbands, each of which is 1 pixel. That is, the low-frequency component LL2 is transformed into a low-frequency component LL3, a horizontal edge component HL3, a vertical edge component LH3, and a diagonal edge component HH3, each of which is 1 pixel. Note that the extent to which entropy, which is an information amount, decreases after a transform has been performed is generally irregular in a natural image such as a photograph. Specifically, the decrease in entropy in LL3 is small whereas, for example, the entropy of a high-frequency component such as HH1 decreases by about 2 to 4 bits.

As illustrated in FIG. 8, the encoding section 131 quantizes frequency components transformed for each of the color components R, G, and B. Specifically, the encoding section 131 calculates a quantized value Q(x) when the input value is x, by the below equation. Note that a function int is an operator that rounds the result down to the nearest integer.

$$Q(x)=\text{int}\{(x+QS/2)/QS\}$$

In the above equation, in consideration of the form in which quantization is achieved by using hardware, a value that is able to be obtained by shift computation, where a division is not used, is given. For a quantization shift value QS, the employed value is greater as the frequency component is higher. The reason for this is that, in general, the higher the frequency component, the frequency component is less likely to be visually perceived by human even when the compression ratio is high.

FIG. 10 is an illustrative diagram illustrating exemplary quantization shift values QS. In FIG. 10, the case of preparing tables of three types, qualities q0, q1, and q2, which indicate the degrees of image quality of an image after quantization, is illustrated. The image quality increases in the order of qualities q0, q1, and q2. As illustrated in FIG. 10, as compared with quality q0, quality q1 has small quantization shift values QS associated with the frequency components HL2, LH2, and HH2 and with the frequency components HL1, LH1, and HH1, and therefore the number of discarded bits is small and the compression ratio is low whereas, on the other hand, the image quality is good. Similarly, as compared with quality q1, quality q2 has a small quantization shift value QS associated with the frequency components HL1, LH1, and HH1, and therefore the number of discarded bits is small and the compression ratio is low whereas, on the other hand, the image quality is good.

As illustrated in FIG. 8, the encoding section 131 transforms each component after quantization into a variable length code in accordance with the corresponding occurrence probability. Specifically, the encoding section 131 first transforms the DC component LL1 into a variable length code and then transforms the AC coefficient group HL2, LH2, and HH2 into variable length codes. The encoding section 131 then transforms each component of the AC coefficient group HL1, LH1, and HH1 into a variable length code three times. Then, as illustrated in FIG. 4, the encoding section 131 outputs a tag signal and encoded data after irreversible transformation in a compressed stream (step S265). Specifically, the encoding section 131 outputs, in a compressed stream, a tag signal of a fixed-length of 1 bit and encoded data after irreversible transformation for one block. Thus, irreversible encoding for one block is complete. Note that the compressed data obtained in steps S255 to S265 corresponds to the first compressed data in Summary section.

As illustrated in FIG. 4, by repeatedly performing the process of steps S210 to S270 described above, the encoding section 131 encodes block data such that each piece of the block data is encoded by either dictionary encoding or irreversible encoding. When encoding of all of the block data is complete (step S270: YES), the encoded data is regarded as being completed and the image encoding process (step S100 in FIG. 3) ends.

A4. Image Decoding Process:

Decoding of encoded data that is performed in the printing apparatus 200 will now be described. An image decoding process is performed by the decoding section 230 of the printing apparatus 200. As described above, the decoding section 230 is configured by hardware.

Figure 11:
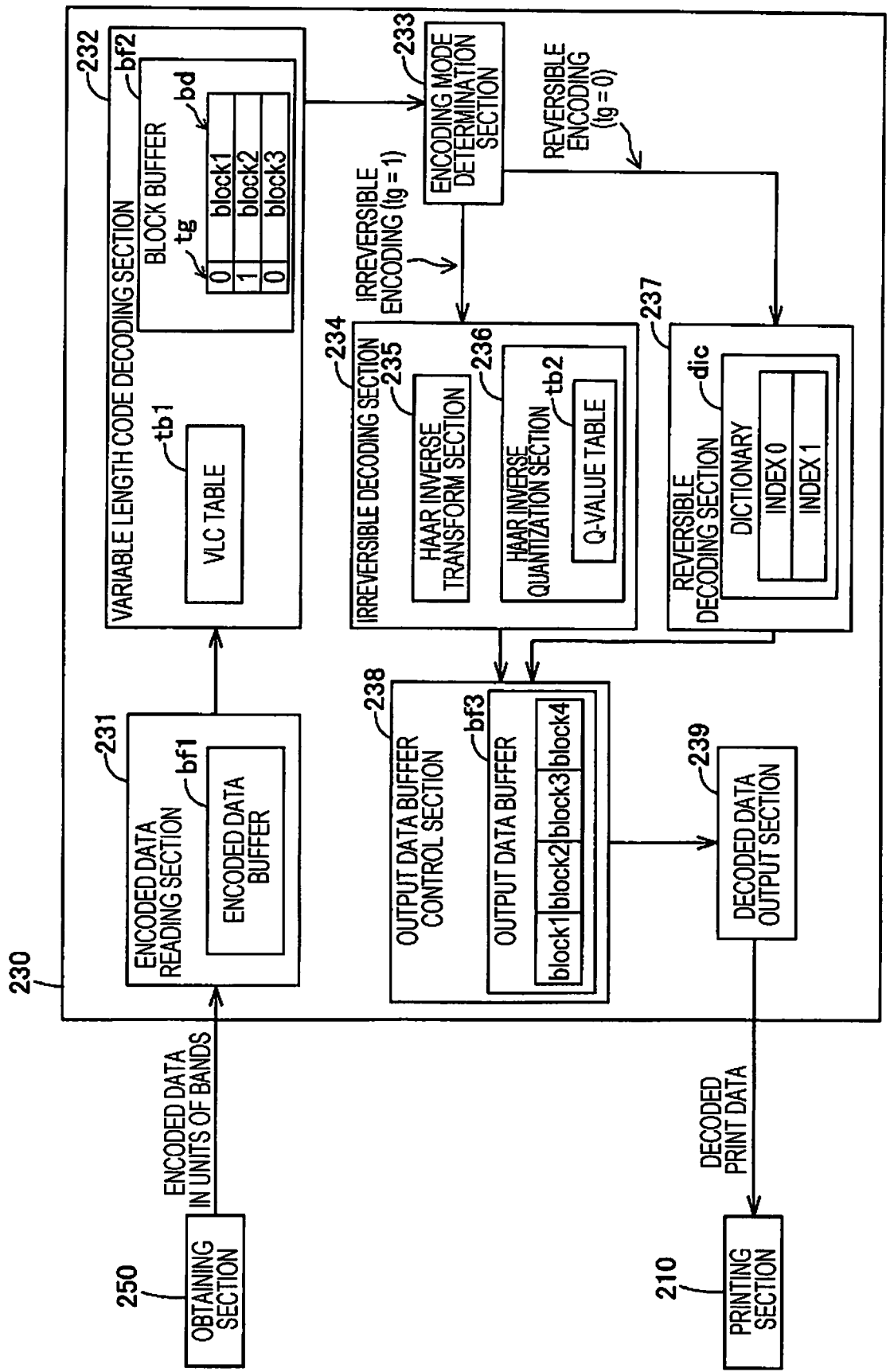
FIG. 11 is a block diagram illustrating an internal configuration of a decoding section.

FIG. 11 is a block diagram illustrating an internal configuration of the decoding section 230. The decoding section 230 includes an encoded data reading section 231, a variable length code decoding section 232, an encoding mode determination section 233, an irreversible decoding section 234, a reversible decoding section 237, an output data buffer control section 238, and a decoded data output section 239.

The encoded data reading section 231 reads, into an encoded data buffer bf1, encoded data in units of bands obtained from the printing control apparatus 100 via the obtaining section 250. In the present embodiment, the band means rasters the number of which corresponds to the number of pixels of a predetermined number of blocks in the sub-scanning direction D2 in an image to be printed. In the present embodiment, the predetermined number mentioned above is eight and one band consists of 64 rasters. Note that the predetermined number may be any natural number instead of eight.

The variable length code decoding section 232 divides encoded data in units of bands stored in the encoded data buffer bf1 into units of blocks by using a VLC table tb1 and stores the resulting data in a block buffer bf2. The VLC table tb1 is a table illustrated in FIG. 5 used in the above-described image encoding process. In FIG. 11, encoded data that is divided into units of blocks and is stored in the block buffer bf2 is illustrated. As each piece of encoded data, a tag signal tg, which is a flag indicting the coding mode type, and a variable length encoded data bd are stored. As described above, the tag signal tg is 1-bit fixed length data and therefore can be read simultaneously with the variable length encoded data bd. As described in the above image encoding process, when the tag signal tg has a value of zero, the variable length encoded data bd is encoded by using a reversible code, and when the tag signal tg has a value of one, the variable length encoded data bd is encoded by using an irreversible code.

The encoding mode determination section 233 reads encoded data in units of blocks from the block buffer bf2 to detect the tag signal tg and, in accordance with the value of the detected tag signal tg, determines whether the variable length encoded data bd is encoded by using a reversible code or is encoded by using an irreversible code. If the variable length encoded data bd is encoded by using a reversible code, the variable length encoded data bd is decoded by the reversible decoding section 237. If, however, the variable length encoded data bd is encoded by using an irreversible code, the variable length encoded data bd is decoded by the irreversible decoding section 234.

The irreversible decoding section 234 decodes the variable length encoded data bd encoded in an irreversible coding mode. The irreversible decoding section 234 is enabled when it is determined by the encoding mode determination section 233 that the variable length encoded data bd is irreversibly encoded. The irreversible decoding section 234 includes a Haar inverse transform section 235 and a Haar inverse quantization section 236. The Haar inverse transform section 235 applies a Haar inverse transform to the variable length encoded data bd. The Haar inverse quantization section 236 applies inverse quantization to the variable length encoded data bd to which the Haar inverse transform has been applied, by using a Q-value table tb2. As the Q-value table tb2, for example, a table illustrated in FIG. 10 is used. Data decoded through the Haar transform and the Haar inverse quantization is output to the output data buffer control section 238.

As illustrated in FIG. 11, the reversible decoding section 237 decodes the variable length encoded data bd encoded in a reversible coding mode. The reversible decoding section 237 is enabled when it is determined by the mode determination section 233 that the variable length encoded data bd is reversibly encoded. The reversible decoding section 237 references the same dictionary dic as used in reversible encoding and performs a reverse lookup on a code associated with the dictionary index of the variable length encoded data bd, thereby decoding encoded data. The reversible decoding section 237 decodes one pixel in one cycle by using the dictionary dic used in reversible encoding. The decoded data is output to the output data buffer control section 238.

The decoded data buffer control section 238 stores, in an output data buffer bf3, the print data decoded in units of blocks, which has been decoded by the irreversible decoding section 234 or the reversible decoding section 237. The decoded data output section 239 transmits, to the printing section 210, the print data decoded in units of blocks stored in the output data buffer bf3. The printing section 210 generates print data from the received, decoded print data and performs printing based on such print data.

Figure 12:
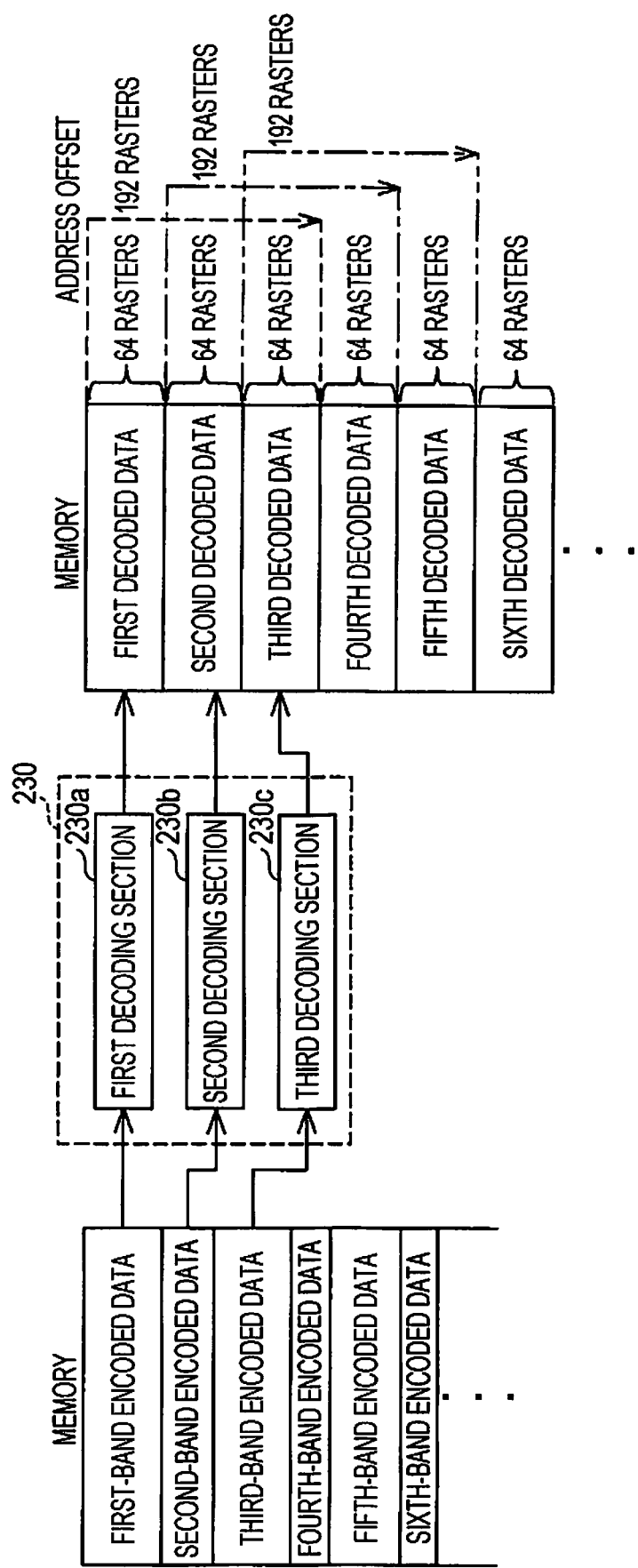
FIG. 12 is an illustrative diagram schematically illustrating a manner of decoding performed by a decoding section.

FIG. 12 is an illustrative diagram schematically illustrating manners of decoding performed by the decoding section 230. As illustrated in FIG. 12, as the decoding section 230, a first decoding section 230a, a second decoding section 230b, and a third decoding section 230c are arranged in parallel. Each of the decoding sections 230a, 230b, and 230c has a configuration similar to the configuration of the decoding section 230 illustrated in FIG. 11. As illustrated in FIG. 12, encoded data divided in units of bands is read into a memory and then the encoded data is decoded in order from the closest to the head address by the first decoding section 230a, the second decoding section 230b, and the third decoding section 230c. Specifically, the first decoding section 230a decodes first-band encoded data, the second decoding section 230b decodes second-band encoded data, and the third decoding section 230c decodes third-band encoded data, in parallel. That is, the decoding section 230 simultaneously decodes encoded data of three bands. As described above, each of the decoding sections 230a, 230b, and 230c has a configuration in which one pixel can be decoded in three cycles. Accordingly, the decoding section 230 may decode image data of 1 pixel in one cycle.

As described above, since one band consists of 64 rasters, the amount of decoded data is uniformly 64 rasters. Therefore, as described in FIG. 12, in a memory in which decoded data is to be stored, the head address at which each of the decoding sections 230a, 230b, and 230c outputs decoded data is shifted by 192 rasters. Accordingly, for example, when the first decoding section 230a completes decoding of first-band encoded data and subsequently performs decoding of fourth-band encoded data, regardless of how decoding of the second decoding section 230b and the third decoding section 230c is being performed, the head address of a destination to which decoded data of the fourth-band encoded data is to be output may be an address obtained by shifting the head address of the first decoded data backward by 192.

Similarly for the second decoding section 230b and the third decoding section 230c, in sequentially outputting decoded data to the memory, the head address of the destination may be shifted backward by 192. This allows an address offset, which is the amount by which the head address of the output destination of decoded data is shifted, to be common among the decoding sections 230a, 230b, and 230c. In addition, when, in the encoding section 131 and the decoding section 230, the amount of data of one band in encoding is set in advance to be common, the decoding section 230 may automatically set the head address for decoded data in accordance with the amount of data of one band.

According to the printing system 300 in the present embodiment described above, the printing control apparatus 100 generates encoded data as either irreversibly encoded data, in which orthogonal transformation is performed in units of blocks, each of which consists of 8 by 8 pixels, of an RGB image for each of the color components R, G, and B, or reversibly encoded data, in which, by using the dictionary dic in which a plurality of different colors are registered as indexes, an index associated with the color of each pixel is compressed with a variable length code. Thus, encoding with a high compression efficiency may be achieved. The printing apparatus 200 includes the decoding section 230 that decodes, among encoded data, irreversibly encoded data in three cycles and decodes reversibly encoded data in one cycle by referencing the dictionary dic, thereby obtaining print data decoded in units of blocks. Thus, decoding processes may be easily performed in parallel, and the processing time required for the decoding processes of the entire encoded image data may be reduced.

B. Other Embodiments (1) Although, in the embodiment described above, an image to be printed is an RGB image of a total of 24 bits, 8 bits for each of R, G, and B, the present disclosure is not limited to this. For example, an image to be printed may be a monochrome image. In the case where an image to be printed is a monochrome image, since the number of gradations is 8 bits per pixel, pixel data may be represented by luminance. In addition, inclusion of at least two decoding sections 230 in parallel allows the entire decoding section 230 to decode 2 pixels in one cycle. In such a configuration, advantages similar to the advantages in the above embodiment are obtained.

(2) Although, in each of the above embodiments, one band consists of 64 rasters, one band may consist of, for example, 8 rasters corresponding to the number of pixels of one block or 192 rasters corresponding to the number of pixels of 24 blocks. That is, it is generally sufficient that one band consist of rasters the number of which corresponds to the number of pixels of any natural number of blocks in the sub-scanning direction D2 in an image to be printed and that a configuration in which one band consists of at least two rasters or more be employed. In such a configuration, advantages similar to the advantages in each of the above embodiments are obtained.

(3) In each of the above embodiments, the printing apparatus 200 may include at least some of the functions of the printing control apparatus 100. The printing control apparatus 100 may have at least some of the functions of the printing apparatus 200. In such a configuration, advantages similar to the advantages in each of the above embodiments are obtained.

(4) Although, in each of the above embodiments, the obtaining section 250 obtains encoded data in units of bands and the decoding section 230 decodes encoded data in units of bands, the present disclosure is not limited to this. For example, the decoding section 230 may obtain encoded data in units of blocks and may decode the encoded data in units of blocks. In such a configuration, advantages similar to the advantages in each of the above embodiments are obtained.

(5) In each of the above embodiments, the Haar wavelet transform is used. However, instead of the Haar wavelet transform, an irreversible encoding technique such as the discrete cosine transform or sub-band encoding may be used. In such a configuration, advantages similar to the advantages in each of the above embodiments are obtained.

(6) Although, in each of the above embodiments, the decoding section 230 performs the Haar inverse transform and the Haar inverse quantization, the process of performing the Haar inverse transform and the Haar inverse quantization may be omitted. In such a configuration, advantages similar to the advantages in each of the above embodiments are obtained.

(7) Although, in each of the above embodiments, the encoding section 131 performs orthogonal transformation in units of blocks for each of three color components R, G, and B in step S260, orthogonal transformation is not limited to being performed for the three color components but may be performed for any integer number of, two or more, color components. In such a configuration, advantages similar to the advantages in each of the above embodiments are obtained.

(8) Although, in each of the above embodiments, the decoding sections 230a, 230b, and 230c set an offset to the head address of decoded print data in accordance with the size of rasters, the offset to the head address may be omitted. In such a configuration, advantages similar to the advantages in each of the above embodiments are obtained.

(9) Although, in each of the above embodiments, the decoding section 230 includes three decoding sections 230a, 230b, and 230c, the present disclosure is not limited to this. For example, the decoding section 230 may include six decoding sections. In such a configuration, with the entire decoding section 230, decoding of two pixels in one cycle may be achieved and a decoding process of the entire image may be further speeded up. That is, in general, when the decoding section 230 has a configuration in which any integer number of, two or more, decoding sections are included, advantages similar to the advantages in each of the above embodiments are obtained.

(10) Although, in each of the above embodiments, the decoding section 230 includes a plurality of decoding sections, the decoding section 230 may consist of a single decoding section. In such a configuration, the decoding section 230 and the printing apparatus 200 may be reduced in size. In such a configuration, advantages similar to the advantages in each of the above embodiments are obtained.

(11) Although, in each of the above embodiments, the printing apparatus 200 includes the single obtaining section 250 and a plurality of decoding sections 230 in association with each other, the present disclosure is not limited to this. For example, the printing apparatus 200 may include a plurality of obtaining sections in such a manner that the obtaining sections and the decoding sections are associated with each other. In such a configuration, each obtaining section may sequentially obtain encoded data in units of bands in the printing direction and each decoding section may decode encoded data obtained by an obtaining section associated therewith. Then, the printing section may sequentially print decoded print data, which has been decoded by each decoding section, in the printing direction. In such a configuration, advantages similar to the advantages in each of the embodiments are obtained.

(12) Although, in each of the embodiments, the printing apparatus 200 is an ink jet printer that performs printing using ink of four colors (cyan, magenta, yellow, and black), the present disclosure is not limited to this. The number of colors of ink to be used may differ from the above. Specifically, five colors including, in addition to the above-mentioned four colors, a spot color may be used, or seven colors including three colors, light grey, light cyan, and light magenta, may be used. In such configurations, the number of decoding sections 230 arranged in parallel may be suitably changed according to specifications requested by the printing system 300. In such a configuration, advantages similar to the advantages in each of the embodiments are obtained.

(13) In each of the above embodiments, part of the configuration implemented by hardware may be replaced with software, and conversely part of the configuration implemented by software may be replaced with hardware. In addition, when some or all of the functions of the present disclosure are achieved by software, the software (computer programs) may be provided in a form in which the software is stored in a computer-readable recording medium. In the present disclosure, the term "computer-readable recording medium" is not limited to a portable recording medium, such as a floppy disk or a compact disc ROM (CD-ROM), but also includes the computer's internal storage devices, such as various types of RAM and ROM, and external storage devices fixed to the computer, such as hard disk drives. That is, the "computer-readable recording medium" has a broad meaning including any recording medium on which data can be not temporarily fixed.

The present disclosure is not limited to the embodiments described above and may be implemented in various configurations without departing from the scope of the gist thereof. For example, technical features in embodiments corresponding to technical features in each of the forms described in the Summary section may be appropriately replaced or combined in order to solve some or all of the problems described above or to achieve some of all of the advantages described above. In addition, if the technical features are not described as essential herein, the technical features may be appropriately deleted.

C. Other Forms (1) According to an embodiment of the present disclosure, a printing apparatus is provided. This printing apparatus is a printing apparatus that prints an image. The printing apparatus includes at least one obtaining section that divides the image into a plurality of blocks of a plurality of pixels and obtains encoded data in which compression is performed in units of the blocks; at least one decoding section that decodes the obtained encoded data in units of the blocks to obtain image data for printing; and a printing section that performs printing by using the obtained image data for printing. The encoded data is encoded data including, for a respective one of the blocks, first compressed data in which quantized values obtained by quantizing frequency components obtained by performing orthogonal transformation for a respective one of N color components, N being an integer of two or more, are respectively compressed by variable length codes, and second compressed data in which, by using a dictionary in which a plurality of different colors are registered as indexes, a corresponding one of the indexes associated with a color of each pixel is compressed by a variable length code. The at least one decoding section decodes, among the obtained encoded data, the first compressed data in N cycles and decodes the second compressed data in one cycle by referencing the dictionary to obtain print data decoded in units of the blocks.

According to the printing apparatus in this form, an image is divided into a plurality of blocks of a plurality of pixels, and encoded data is obtained. The obtained encoded data includes, for a respective one of the blocks, first compressed data in which quantized values obtained by quantizing frequency components obtained by performing orthogonal transformation for a respective one of N (N being an integer of two or more) color components are respectively compressed by variable length codes, and second compressed data in which, by using a dictionary in which a plurality of different colors are registered as indexes, a corresponding one of the indexes associated with the color of each pixel is compressed by a variable length code. Thus, encoded data with a high compression efficiency may be obtained. In addition, the first compressed data is decoded in N cycles and the second compressed data is decoded in one cycle by reference to the dictionary. Thus, decoding processes may easily be performed in parallel, and the processing time required for the decoding processes of the entire encoded image data may be reduced.

(2) In the printing apparatus in the above form, the at least one decoding section may further perform inverse orthogonal transformation and inverse quantization. According to the printing apparatus in this form, since the at least one decoding section further performs inverse orthogonal transformation and inverse quantization, the printing apparatus may be reduced in size as compared with a configuration in which a decoding section that perform inverse orthogonal transformation and inverse quantization is further included.

(3) In the printing apparatus in the above form, N may be three. According to the printing apparatus in this form, since N is three, among the first compressed data in which, for a respective one of blocks, orthogonal transformation is performed for a respective one of three color components, data corresponding to 1 pixel may be decoded in three cycles. This may appropriately improve the operation frequency while inhibiting the configuration of the decoding section from becoming complex.

(4) In the printing apparatus in the above form, the at least one obtaining section and the at least one decoding section may include S obtaining sections and S decoding sections associated with each other, S being an integer of two or more; a respective one of the S obtaining sections may sequentially obtain, in a printing direction, the encoded data in a unit of a band that is in a unit of rasters the number of which corresponds to the number of pixels of M blocks among the blocks in the printing direction of the image, M being a natural number; a respective one of the S decoding sections may decode the encoded data obtained by the rasters by an associated one of the S obtaining sections; and the printing section may sequentially print, in the printing direction, the decoded print data from each of the decoding sections.

According to the printing apparatus in this form, a respective one of the S obtaining sections sequentially obtains the encoded data in a unit of band that is in a unit of rasters, a respective one of the S decoding sections decodes the encoded data obtained by the rasters by an associated one of the obtaining sections, and the printing section sequentially prints, in the printing direction, decoded print data from each decoding section. Thus, decoding processes in decoding sections may be easily performed in parallel, and the speed at which the entire decoding process of encoded data is performed may be improved.

(5) In the printing apparatus in the above form, the at least one decoding section may set an offset to the head address of the decoded print data in accordance with the size of the rasters. According to the printing apparatus in this form, the decoding section sets an offset to the head address of the decoded print data in accordance with the size of band data. Thus, in a configuration in which a plurality of decoding sections perform decoding processes in parallel, one decoding section may output decoded print data without waiting for completion of decoding processes in other decoding sections, and the processing time required for decoding processes of the entire image data may be further reduced.

The present disclosure may be implemented in various forms. For example, the present disclosure may be implemented in forms such as a printing apparatus, a printing method, a printing system including an encoding apparatus and the printing apparatus, a computer program for implementing such an apparatus, method, and system, and a recording medium on which such a computer program is recorded.

What is claimed is:

1. A printing apparatus that prints an image, comprising:
at least one obtaining section that divides the image into a plurality of blocks of a plurality of pixels and obtains encoded data in which compression is performed in units of the blocks;
at least one decoding section that decodes the obtained encoded data in units of the blocks to obtain image data for printing; and
a printing section that performs printing by using the obtained image data for printing,
wherein
the encoded data is encoded data including, for a respective one of the blocks, first compressed data in which quantized values obtained by quantizing frequency components obtained by performing orthogonal transformation for a respective one of N color components, N being an integer of two or more, are respectively compressed by variable length codes, and second compressed data in which, by using a dictionary in which a plurality of different colors are registered as indexes, a corresponding one of the indexes associated with a color of each pixel is compressed by a variable length code, and
the at least one decoding section decodes, among the obtained encoded data, the first compressed data in N cycles and decodes the second compressed data in one cycle by referencing the dictionary to obtain print data decoded in units of the blocks.

2. The printing apparatus according to claim 1, wherein the at least one decoding section further performs inverse orthogonal transformation and inverse quantization.

3. The printing apparatus according to claim 1, wherein N is three.

4. The printing apparatus according to claim 1, wherein
the at least one obtaining section and the at least one decoding section respectively include S obtaining sections and S decoding sections associated with each other, S being an integer of two or more,
a respective one of the S obtaining sections sequentially obtains, in a printing direction, the encoded data in a unit of a band that is in a unit of rasters the number of which corresponds to the number of pixels of M blocks among the blocks in the printing direction of the image, M being a natural number,
a respective one of the S decoding sections decodes the encoded data obtained by the rasters by an associated one of the S obtaining sections, and
the printing section sequentially prints, in the printing direction, the decoded print data from each of the decoding sections.

5. The printing apparatus according to claim 1, wherein
the at least one obtaining section and the at least one decoding section respectively include S obtaining sections and S decoding sections associated with each other, S being an integer of two or more,
a respective one of the S obtaining sections sequentially obtains, in a printing direction, the encoded data in a unit of a band that is in a unit of rasters the number of which corresponds to the number of pixels of M blocks among the blocks in the printing direction of the image, M being a natural number,
a respective one of the S decoding sections decodes the encoded data by the rasters obtained by an associated one of the S obtaining sections,
the printing section sequentially prints, in the printing direction, the decoded print data from each of the decoding sections, and
the at least one decoding section sets an offset to a head address of the decoded print data in accordance with a size of the rasters.

6. A printing method performed by a printing apparatus that prints an image, comprising:
dividing the image into a plurality of blocks of a plurality of pixels and obtaining encoded data in which compression is performed in units of the blocks;
decoding the obtained encoded data in units of the blocks to obtain image data for printing; and
performing printing by using the obtained image data for printing,
wherein
the encoded data is encoded data including, for a respective one of the blocks, first compressed data in which quantized values obtained by quantizing frequency components obtained by performing orthogonal transformation for a respective one of N color components, N being an integer of two or more, are respectively compressed by variable length codes, and second compressed data in which, by using a dictionary in which a plurality of different colors are registered as indexes, a corresponding one of the indexes associated with a color of each pixel is compressed by a variable length code, and
the decoding decodes, among the obtained encoded data, the first compressed data in N cycles and decodes the second compressed data in one cycle by referencing the dictionary to obtain print data decoded in units of the blocks.

7. A printing system comprising:
an encoding apparatus that compresses image data of an image into encoded data; and a printing apparatus that obtains the encoded data from the encoding apparatus, decodes the encoded data into print data, and prints the print data,
wherein
the encoding apparatus
divides the image into a plurality of blocks of a plurality of pixels and generates the encoded data as encoded data including, for a respective one of the blocks, first compressed data in which quantized values obtained by quantizing frequency components obtained by performing orthogonal transformation for a respective one of N color components, N being an integer of two or more, are respectively compressed by variable length codes, and second compressed data in which, by using a dictionary in which a plurality of different colors are registered as indexes, a corresponding one of the indexes associated with a color of each pixel is compressed by a variable length code, and
the printing apparatus includes
an obtaining section that obtains the encoded data,
a decoding section that decodes, among the obtained encoded data, the first compressed data in N cycles and decodes the second compressed data in one cycle by referencing the dictionary to obtain image data for printing in units of the blocks, and
a printing section that performs printing by using the obtained image data for printing.

* * * * *